United States Patent
Kempf et al.

[11] Patent Number: 5,876,082
[45] Date of Patent: Mar. 2, 1999

[54] DEVICE FOR GRIPPING AND HOLDING SUBSTRATES

[75] Inventors: Stefan Kempf, Alzenau-Albstadt; Michael Reising, Mömbrive, both of Germany

[73] Assignee: Singulus Technologies GmbH, Alzenau, Germany

[21] Appl. No.: 801,644

[22] Filed: Feb. 18, 1997

[30] Foreign Application Priority Data

Feb. 15, 1996 [DE] Germany ............. 196 05 598.9

[51] Int. Cl.⁶ ................. C23C 14/50; B23Q 3/08
[52] U.S. Cl. ................................................ 294/95
[58] Field of Search ............... 294/95, 97, 64.1, 294/88; 118/500, 502, 503, 728; 369/270, 271; 360/99.05; 279/2.06–2.09

[56] References Cited

U.S. PATENT DOCUMENTS

| | | | |
|---|---|---|---|
| 4,948,187 | 8/1990 | Blaseck | 294/95 |
| 5,637,200 | 6/1997 | Tsymberov | 118/728 X |

FOREIGN PATENT DOCUMENTS

| | | | |
|---|---|---|---|
| 1185285 | 2/1959 | France | 294/95 |
| 93 07 263.5 | 7/1993 | Germany. | |
| 43792 | 3/1984 | Japan | 294/95 |

*Primary Examiner*—David A. Bucci
*Attorney, Agent, or Firm*—Pillsbury Madison & Sutro

[57] ABSTRACT

A device 1 for gripping and holding substrates 2 with one or several substrate holders 5 arranged in a vacuum chamber 4, 4', 4" and one or several displaceably arranged grippers 3, which can be displaced into a first position through the action of an operating pressure or against the action of a spring 6, and into a second position through the action of a diaphragm 7, which can be exposed to a pneumatic pressure $P_a$ and/or to an operating element 8 cooperating with it, wherein the substrate 2 is held when the diaphragm is in a first position and the substrate 2 is released for being further transported when the diaphragm is in a second position. The diaphragm 7 is integrated into the vacuum chamber in such a way that in an operating position it is exposed to atmospheric pressure $P_a$ on the one side 9 and on the other side 10 to vacuum pressure $P_v$, and in a second position is exposed to vacuum pressure $P_v$ on both sides.

23 Claims, 2 Drawing Sheets

DEVICE FOR GRIPPING AND HOLDING SUBSTRATES

BACKGROUND OF THE INVENTION

The invention relates to a device for gripping and holding substrates with one or several substrate holders arranged in a vacuum chamber and one or several displaceably arranged grippers, which can be displaced into a first position through the action of an operating pressure or against the action of a spring, and into a second position through the action of a diaphragm, which can be exposed to a pneumatic pressure $P_a$ and/or an operating element cooperating with it, wherein the substrate is held in the one position and in the second position the substrate is released for being further transported.

A device for gripping and holding a disklike substrate is disclosed in German Utility Model DE-GM 93 07 263.5. This device comprises a number of circularly arranged grippers and an elastic diaphragm which is disposed in a pressure-proof housing that has an opening. Different pressures can be established on the front and back sides of the diaphragm, and the diaphragm may be arranged such that at a differential pressure, a deflection of the diaphragm out of its position of repose takes place, while at a pressure equilibrium the diaphragm returns to its position of repose via a compression spring.

The differential pressure at the diaphragm is generated in that a bell-shaped housing, which is provided with a central bore, is disposed on one side of the diaphragm. A pressure chamber is formed between the end of the bore of the bell-shaped housing and the surface of the diaphragm. The bore provided in the bell-shaped housing is provided via a pneumatic line with an external pump whose sole function is to establish a differential pressure on the surface of the diaphragm, relative to the vacuum pressure provided in the chamber beneath, so that by imposition of pressure on the diaphragm and by means of an adjusting part adjoining the diaphragm, the gripper arm can be adjusted out of its position that holds the substrate into a further position in which the gripper or grippers release the substrate. Such an apparatus is complicated and expensive, since a separate pump is required to generate this differential pressure, and the diaphragm must be sealed off from the pressure in the vacuum chamber so that the requisite pressure can be generated on the back side of the diaphragm. Moreover, such an arrangement is highly vulnerable to malfunction, since the additionally required pump operates entirely uncoupled from the other pumps to generate the vacuum pressure in the vacuum chamber, so that a completely exact adaptation to the operating process for adjusting the diaphragm and removing the substrate is impossible. Overall, such an apparatus works relatively slowly, since the release of the substrate cannot occur until the necessary system pressure downstream of the diaphragm has built up via the independent pump. The compressed-air supply line must be disposed flexibly relative to the holding mechanism.

SUMMARY OF THE INVENTION

It is the object of the invention to employ the differential pressure occurring between atmospheric pressure and the vacuum pressure as a control pressure for displacing the substrate grippers.

The invention solves these problems in that the diaphragm is provided between the vacuum chamber and the lock chamber. Because of the advantageous design and arrangement of the diaphragm it is possible to omit an additional pump for displacing the diaphragm, since with the device in accordance with the invention it is possible to employ the differential pressure between the pressure in the vacuum chamber and the pressure in the flooded chamber for displacing the diaphragm and thus for displacing the grippers. By means of this it is automatically assured that immediately upon initiating the flooding of the chamber located above the substrate the diaphragm will respond, move along a displacement path and in this way release the gripper automatically, i.e. as a function of the flooding. Because of this, the arrangement operates free of interference, very precisely and also considerably more rapidly than the known arrangements. Since the differential pressure between the atmospheric pressure and the pressure in the vacuum chamber is employed as an operating value for displacing the diaphragm, it is possible, as already explained, to omit an additional pump, control valves and the elements sealing the diaphragm against the vacuum chamber with the required penetration, so that as a whole a very cost-effective device for holding and releasing the substrates is provided. Because of doing without additional pump units, the device in accordance with the invention operates considerably more dependably and as a whole has a considerably longer service life than the known devices. Because of the advantageous employment of the differential pressure in connection with the arrangement of the diaphragm in accordance with the invention, exterior control of the individual grippers can be omitted. The proclivity to breakdowns is further reduced in that forced displacement of the grippers takes place only by flooding the chamber. Since they depend on the differential pressure in accordance with the invention and not on an external system, release of the grippers can be achieved in milliseconds.

It is also advantageous that the diaphragm exposed to an approximately constant vacuum pressure $P_v$ on one side is controllable via a differential pressure $P_d = P_a - P_v$ that occurs whenever the chamber for receiving the substrate is flooded.

An additional possibility in accordance with a further feature of the apparatus of the invention is that the diaphragm is controllable via the atmospheric and/or vacuum pressure or the differential pressure $P_d$ that results from the atmospheric pressure $P_a$ in the lock chamber, minus the vacuum pressure $P_v$ in the vacuum chamber. Because of the advantageous disposition of the diaphragm, which protrudes into the vacuum chamber, it is possible for the first time in a simple way to use the vacuum pressure occurring in the chamber as a manipulated variable for adjusting the diaphragm.

According to a further feature of the invention, it is advantageous that the diaphragm disposed in the vacuum chamber is formed of one flexible part and one nonflexible part or a metal part or plate. By using one flexible and one nonflexible part to form the diaphragm, an exact guidance of the adjusting part for adjusting or pivoting the grippers is created.

In a preferred embodiment of the invention, it is finally provided that the nonflexible part is firmly joined to the flexible part of the diaphragm, and that the nonflexible part is embodied as a circular-round plate, which covers an opening of the diaphragm.

It is also advantageous that the flexible part of the diaphragm is firmly connected by its outer edge to a flange of the device and by its inner edge to the edge of the opening provided in the plate, and that the diaphragm and the plate seal off the chamber, which is exposed to a constant vacuum pressure $P_v$, from the chamber or lock chamber that can be exposed to an atmospheric pressure $P_a$.

It is moreover advantageous that the outer edge of the diaphragm can be clamped and secured in at least one groove provided between the flange and the outer part of the substrate holder, and that the plate is joined or screwed, via a coaxial protrusion, to a cylindrical part that is guided on a protrusion joined to a likewise coaxially arranged flange. By using a groove to receive the outer edge of the diaphragm, a very simple type of fastening for the diaphragm is obtained, which moreover has a high degree of tightness relative to the flooded chamber and the vacuum chamber. Since the plate is joined or screwed to the cylindrical part via a coaxial protrusion, the diaphragm can be released easily if it should become damaged. Releasing the diaphragm is done simply by unscrewing the plate and releasing the clamping connection of the diaphragm. After that, these parts can easily be replaced.

It is also advantageous that the cylindrical part is firmly joined to the adjusting part, and that the adjusting part rests against one or more grippers in the region of its one end.

One additional option in accordance with a further feature of the apparatus of the invention is that the cylindrical part, with its one or second end or its plate, can be placed against a fixed flange and with its first or other end or adjusting part against the gripper or lever arm of the gripper, and that if differential pressure $P_d$ occurs, the diaphragm moves farther into the vacuum chamber and in the process moves the gripper or grippers away from the bore edge of the substrate and releases the substrate.

According to a farther feature of the invention, it is advantageous that the fixed flange is indirectly or directly firmly joined to the flange of the device and has a cylindrical extension in which the spring is received. By using a cylindrical extension on the fixed flange, good guidance of the spring is assured and at the same time it is assured that an immediate adjustment of the grippers takes place when there is a pressure equilibrium between the two chambers.

It is also advantageous that between the flange of the device and the fixed flange, a support part for the pivotable reception of the grippers is provided, and that the fixed flange and the support part are releasably joined to the flange of the device via the same connecting elements. Since the support part for receiving the grippers is disposed between the two flanges, a very good, simple fixation of the mount is obtained.

A substantially advantageous embodiment is attained by providing that the chamber or lock chamber located above the diaphragm is evacuated via a first vacuum pump and flooded via a further device, and the chamber located below the diaphragm is evacuated via a second vacuum pump, and the two vacuum pumps or the associated valves are controllable in such a way that the differential pressure $P_d$ can be lowered to nearly zero, and that the upper chamber, which is flooded via a device or a control valve, necessarily thereby initiates the immediate displacement of the grippers, and that the diaphragm is integrated into the vacuum chamber in such a way that in one operating position it is exposed to the atmospheric pressure $P_a$ on the one side and to the vacuum pressure $P_v$ on the other side, and in a second position is exposed to vacuum pressure $P_v$ on both sides.

Further advantages and details of the invention will be described below in the description, and shown in the drawings.

DESCRIPTION OF THE PREFERRED EMBODIMENTS

Figure 1:
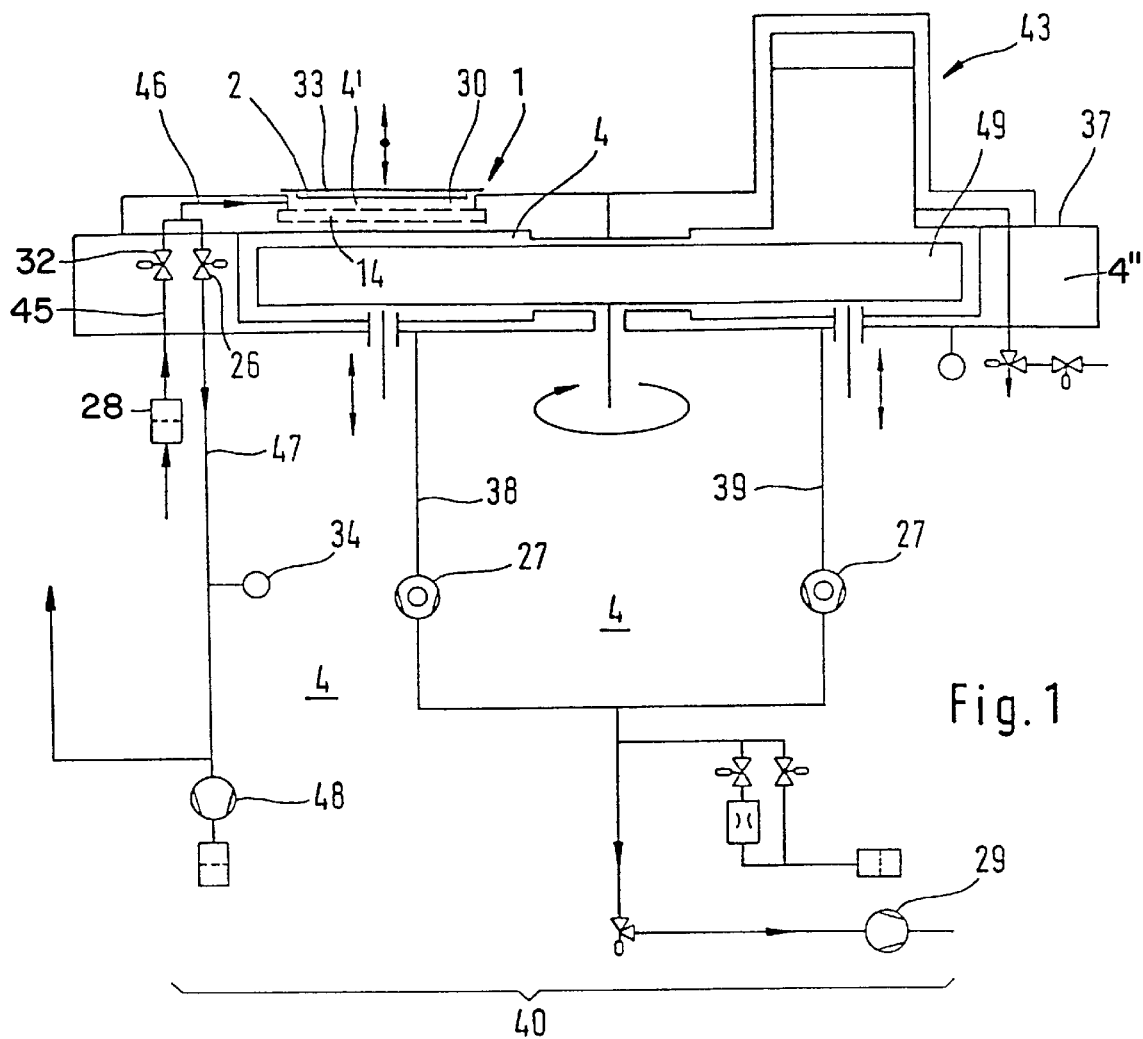
FIG. 1 is a simplified pictorial view of substrate transporting apparatus in a sputtering system.
Figure 2:
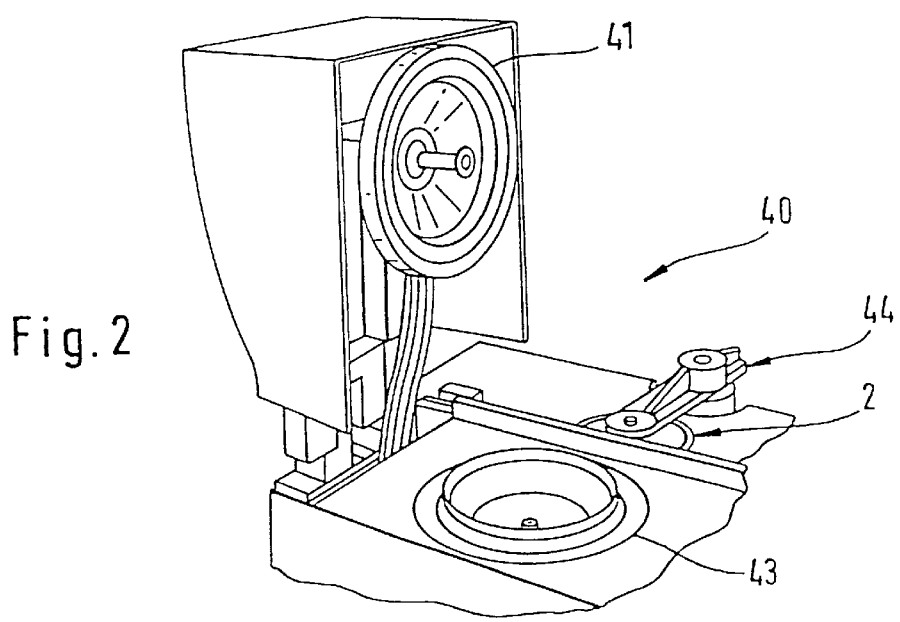
FIG. 2 is a perspective view of an apparatus for coating compact disks.

In the drawing, FIG. 2 shows a perspective view of an upper portion of a sputtering system 40, which includes a gripper arm 44, supported to be rotatable through an angle 180° about a vertical axis, by means of which substrates or compact disks (CD) 2 are delivered to a device, or disk receiver, 1 (FIG. 1) for gripping substrates. Via this device 1, the substrates reach a processing station 43, which also includes a cathode 41 shown in an open position in FIG. 2. The sputtering system shown in FIG. 2 can be constituted, for example, by a system marketed by Singulus Technologies GmbH of Alzenau, Germany, under the model designation SINGULUS III.

In FIG. 1, the functional diagram of the sputtering system 40 is shown along with the essential parts of the apparatus.

The substrate 2 is given up by means of the gripper arm 44 and an associated plate 33, which also includes a gripper device not shown in FIG. 1, to a further device for gripping substrates. In FIG. 1, the plate 33 is located above a plate or substrate receiving part 14. In the position of FIG. 1, the two plates 33 and 14 are oriented coaxially to one another, so that the substrate 2 can be given up by the plate 33 to the substrate receiving part 14.

In the position of FIG. 1, the plate 14 has moved upwardly and seals off an annular volume or lock chamber 30. The lock chamber 30 is located between the upper plate 33 and the lower plate, or substrate receiving part, 14. The gripper elements provided on the plate 33, which are not shown in FIG. 1, hold the compact disk above the substrate receiving part 14.

The lock chamber 30 can be flooded via a filter 28, which for that purpose communicates via a line 45 with a valve 32 that is connected via a further line 46 to the lock chamber 30. By opening the valve 32, the lock chamber 30 is flooded. Once the lock chamber 30 has been flooded, the upper plate is raised, so that the substrate 2 can be replaced. By means of the gripper arm 44, a finished coated compact disk 2 can be delivered to a further transport device, not shown. At the same time, a new compact disk 2 to be processed is placed in the lock chamber 30. Lowering of plate 33 causes an O ring, not shown in the drawing, to be pressed against the surface of a housing 37 of the lock chamber 30, which is thereby closed in vacuum-tight fashion. The atmospheric pressure prevailing in the lock chamber 30 is evacuated by closure of the valve 32, followed by opening of a valve 26 which communicates with the lock chamber 30 via the line 46. A vacuum pump 48 pumps out the air in the lock chamber 30 and generates the requisite vacuum pressure.

In this operation, grippers 3 open, which are shown in detail in FIG. 3 and described in detail below. The grippers 3 grasp the substrate or compact disk 2. This occurs immediately when the pressure in the lock chamber 30 is approximately equivalent to the pressure in a vacuum chamber 4 (FIG. 3), or in other words once a pressure equilibrium has been established. If the lock chamber 30 has been evacuated enough that the requisite measuring pressure, which is ascertained by means of a measuring cell 34, is established, then the device 1 can be lowered downward, and the substrate 2 placed on the turntable 49 (FIG. 1) can be delivered in increments to the processing station 43 by means of the turntable 49. To that end, the turntable 49 rotates onward by 120° in each step. In FIG. 2, turntable 49 is located below station 43 and compact disk 2. The gripper arm 44 shown in FIG. 2 is not shown in FIG. 1. Next, the substrate receiving part 14 is raised and an O ring, not shown, presses against the underside of the cathode 41.

After this work step, the lock chamber 30 can again be flooded via the valve 32. In this flooding process a differential pressure $P_d$ is created, resulting from the atmospheric pressure $P_a$ in the lock chamber 30 and the vacuum pressure $P_v$ in the vacuum chamber 4 (see FIG. 3) ($P_d=P_a-P_v$).

Because of this differential pressure, the grippers 3 are pivoted again and the substrate 2 is released. In this operation, the gripper of the substrate receiving part or of the plate 33 is activated at the same time, so that the substrate can be taken over by the plate 33. This process is repeated continually.

The vacuum chamber 4 is evacuated via the lines 38, 39 and the prepump 29.

Figure 3:
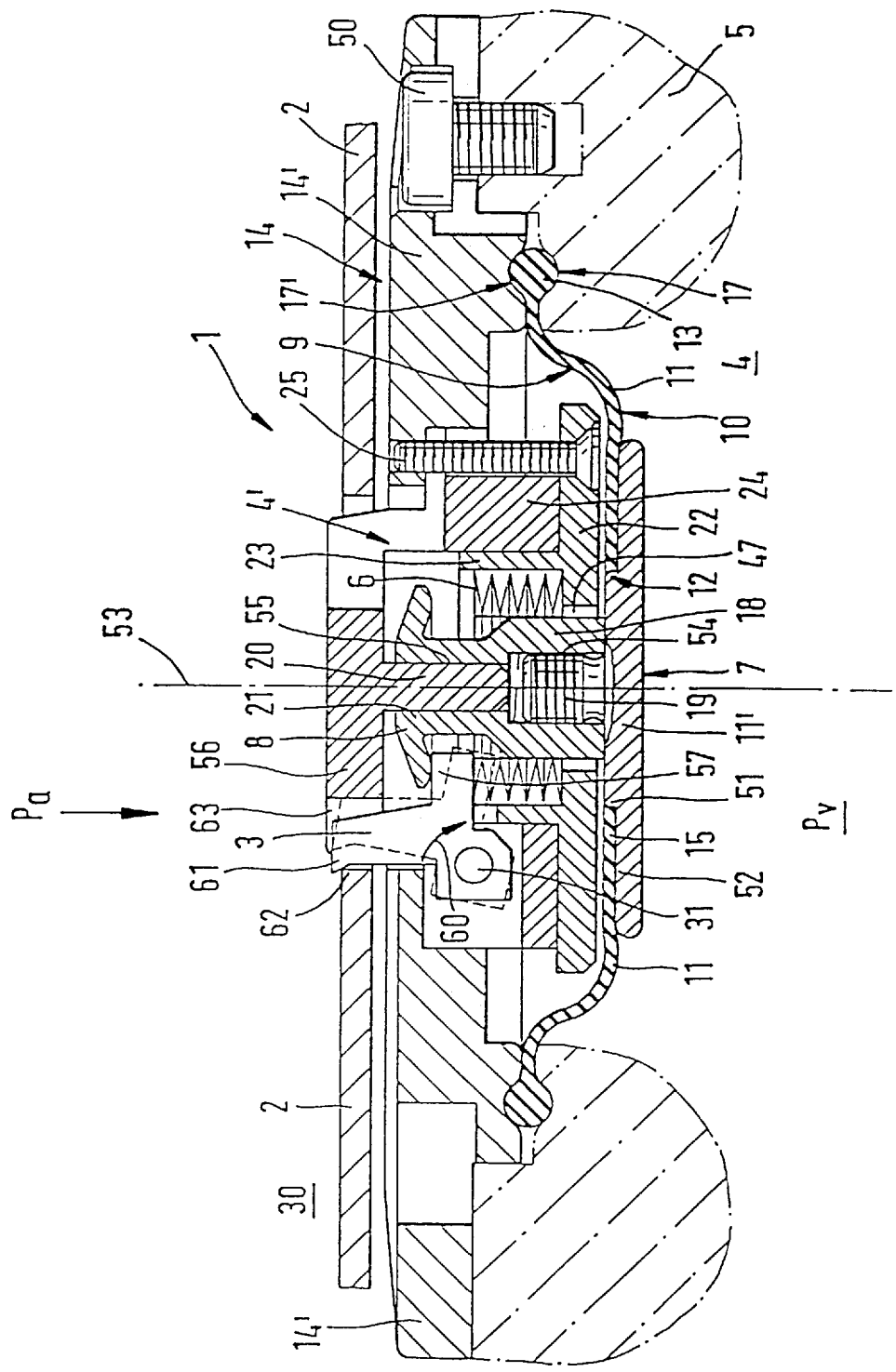
FIG. 3 is a cross-sectional elevational view a device according to the invention for gripping and holding a flat, preferably disklike, substrate.

In FIG. 3, the device 1 for gripping and holding the substrates 2 is shown in detail.

The device 1 comprises a flange 14', which is releasably joined to a substrate holder 5 via screw bolts 50. Between the flange 14' and the substrate holder 5, an annular circular groove 17, 17' is provided, in which a beadlike edge 13 of a diaphragm 7 is clamped. The diaphragm 7 is located in the vacuum chamber 4 and comprises one flexible part 11 and one nonflexible part 11', connected thereto. Nonflexible part 11' is a circular-round plate having a central cylindrical attachment portion 51 that is held in an opening 12 of the diaphragm 7. The plate 11' has a peripheral part 52 to which the flexible part 11 of the diaphragm 7 is secured or vulcanized. The diaphragm 7 seals off the upper portion of a vacuum chamber 4' (FIG. 3) or 4" (FIG. 1) from the vacuum chamber 4 that is exposed to a permanent vacuum pressure $P_v$. A vacuum is always present in chamber 4, located below diaphragm 7. A vacuum can be established in chambers 4' and 4" when cathode 41 is in its closed position and this vacuum will be released when cathode 41 is opened. The flexible part 11 of the diaphragm 7 is connected by its outer edge 13 to flange 14' and by its inner edge 13 to the cylindrical attachment 51. The outer edge 13 is clamped in groove 17, 17' of the flange 14' and substrate holder 5.

The vacuum chamber 4', 4" is exposed to an atmospheric pressure $P_a$ whenever the valve 32, as already mentioned, is opened and the lock chamber 30 is flooded The plate 11' of the diaphragm 7 has a protrusion 19 which is oriented coaxially to a center axis 53 of the device 1. The protrusion 19 is firmly or integrally joined to the plate 11'. The protrusion 19 has male threads 54 and can therefore be joined or releasably screwed to a cylindrical part 18.

To that end, the cylindrical part 18 is likewise oriented coaxially to the flange 14', and in its upper region it has a cylindrical bore 55 into which a protrusion 20 extends. The protrusion 20 is joined to a cylindrical attachment 56, which is fixed to the flange 14' via connecting elements 25. The compact disk or substrate 2 can be slipped onto the cylindrical attachment 56 and held by means of the three or more grippers 3. The cylindrical part 18 is vertically movable with respect to the center axis 53 on the protrusion 20 if a pressure difference $P_d$ occurs.

An adjusting part, or bell-shaped flange, 8 is provided on the upper end of the cylindrical part 18. The adjusting part 8 is firmly connected to, or integral with, an upper end 21 of the cylindrical part 18.

As can be seen from FIG. 3, the flange 8 rests with its outer end against one lever arm 57 of each gripper 3. Each gripper 3 is pivotably mounted on a bolt 31 extending horizontally in terms of FIG. 3, between the position shown in solid lines (substrate holding position) and a position shown in broken lines (substrate release position).

The lower end of the cylindrical part 18 moves with its one end on plate 11' in the direction of the underside of a fixed flange 22, while with its other end, or adjusting part 8, it rests against the grippers 3 or the lever arms 57 thereof. In this operating state, the grippers 3 are oriented in the holding position shown in FIG. 3, in which the substrate 2 is held by the grippers 3. The flange 22 is firmly joined to a support part 24 and to the flange 14' via the connecting elements 25. Located on the flange 22 is a cylindrical extension 23, in which a spring, such as a cup spring, 6 is received. The spring is braced by its lower end against the flange 22 and by its upper end against the lever arms 57 of the grippers 3 and presses these lever arms, in the event of a pressure equilibrium $P_a=P_v$, into their holding position shown in FIG. 3. To that end, the cylindrical spring 6 surrounds the cylindrical part 18. The support part 24 joined to the flange 22 serves the purpose of pivotably receiving the grippers 3. In other words, pivot bolts 31 are held in support part 24. The flange 22 has a bore 47, through which the cylindrical part 18 extends.

The fixed flange 22 and the support part 24 are releasably connected to the flange 14' of the device 1 via the same connecting elements 25. The vacuum chamber 4', 4" provided above the diaphragm 7, or the lock chamber 30 can be flooded via the valve 32 and evacuated via the pump 48, as already explained in conjunction with FIG. 1. The vacuum chamber 4 provided below the diaphragm 7 is not flooded when operation begins, and is evacuated or held at a certain pressure level via a vacuum pump 27 or the prepump 29.

If for the work process and for transporting the substrate 2 the lock chamber 30 or vacuum chamber 4' is flooded via the valve 32 of FIG. 1, then an immediate pressure rise $P_a$ occurs above the diaphragm 7, so that because of the pressure differential ($P_d=P_a-P_v$) the diaphragm 7 moves farther into the vacuum chamber 4, or downward in terms of FIG. 3, and by means of the adjusting part 8, the grippers 3 are pivoted inwardly as indicated by the arrow 60 out of the position shown in solid lines into the position shown in broken lines (substrate release position). In this process, the upper portion 61 of the gripper 3 moves out of range of one edge 62 of a bore 63 of the substrate 2 and in this way releases the substrate or compact disk for transporting.

Accordingly, with the system of the invention, automatic adjustment of the gripper 3 to a release position according to FIG. 3 is always effected when the lock chamber 30 is flooded.

If the lock chamber 30 or vacuum chamber 4' is again evacuated via the pump 48 after the substrate transfer, then a pressure equilibrium is brought about between the lock chamber 30 and the vacuum chamber 4; as a result, the spring 6 moves the lever arms 57 and hence also the adjusting part 8 upward, since the same pressure states now prevail both on one side 9 and another side 10 of the diaphragm 7. As a result, the gripper system operates entirely without malfunction and can respond in the shortest possible time, that is, within milliseconds.

Because of the very fast response time of the grippers 3 and the automatic adjustment on flooding of the lock chamber 30, the stability or the work process becomes freer of malfunction, and the cycle time is further shortened.

Moreover, by means of this arrangement, the device 1 for gripping the substrates can be embodied substantially more simply and can thus be produced more economically, since one can make do with fewer components overall. The previous external triggering of the diaphragm for adjusting the grippers 3 was more vulnerable to malfunction and not so functionally reliable, because of the missing individual parts, for instance if the external supply pump for generating an overpressure at the diaphragm 7 failed. The top side of the diaphragm 7 communicates with the vacuum chamber 4' via the bore 47.

This application relates to subject matter disclosed in German Application number 196 05 598.9, filed on Feb. 15, 1996, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of thepresent invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

We claim:

1. A device (1) for gripping and holding a substrate (2), said device comprising:

a substrate holder (5) and substrate gripping means including at least one substrate gripper (3) displaceably mounted in said substrate holder, said substrate gripper being displaceable between a substrate gripping position for gripping the substrate and a substrate release position for releasing the substrate;

a vacuum chamber (4,4',4") enclosing a region at a vacuum pressure, $P_v$;

a second chamber containing a region exposed to a pneumatic pressure, $P_a$; and a diaphragm (7) operatively associated with said substrate gripper so that said substrate gripper moves between said substrate gripping position and said substrate release position in response to movement of said diaphragm, wherein said diaphragm is interposed between said vacuum chamber and said second chamber, and the vacuum pressure, $P_v$, is approximately constant.

2. The device in accordance with claim 1, wherein said second chamber is a lock chamber provided to receive the substrate, said diaphragm has a first side exposed to said region enclosed by said vacuum chamber, and movement of said diaphragm is controlled by a differential pressure $P_d = P_a - P_v$ which occurs when said lock chamber is in a condition for receiving the substrate.

3. The device in accordance with claim 1, wherein movement of said diaphragm can be controlled by atmospheric pressure and/or a vacuum pressure, or a differential pressure $P_d$ which is the result of atmospheric pressure $P_a$ in said second chamber minus the vacuum pressure $P_v$ in said vacuum chamber.

4. The device in accordance with claim 1, wherein said diaphragm comprises a flexible part (11) and an inflexible part (11').

5. The device in accordance with claim 1, wherein said inflexible part is fixedly connected to said flexible part.

6. The device in accordance with claim 1, wherein said flexible part has a central opening (12) and said inflexible part is a circular plate which covers said central opening.

7. The device in accordance with claim 6, wherein said diaphragm seals said vacuum chamber, in which the region is at a constant vacuum pressure $P_v$, from a chamber which can be subjected to an atmospheric pressure $P_a$.

8. The device in accordance with claim 6, wherein said flexible part has an inner edge (15) delimiting said central opening and an outer edge (13), said device further comprises a first flange (14), said outer edge of said diaphragm is fixedly connected to said first flange, and said inner edge of said diaphragm is fixedly connected to said circular plate.

9. The device in accordance with claim 8, wherein said substrate holder has an exterior part, and said first flange and said exterior part together define a groove in which said outer edge of said diaphragm is wedged and secured.

10. The device in accordance with claim 1, wherein: said device further comprises a first flange (14); said diaphragm comprises a flexible part (11) and an inflexible part (11'); and said substrate gripping means further comprise a coaxial pin (19) fixed to said inflexible part, a cylindrical element (18) fixed to said coaxial pin, and a guide pin (20) disposed for guiding said cylindrical element and connected to said first flange.

11. The device in accordance with claim 10, wherein said substrate gripping means further comprise an operating element (8) fixedly connected with said cylindrical element.

12. The device in accordance with claim 11, wherein said operating element has a first end which rests against said substrate gripper.

13. The device in accordance with claim 12, further comprising a second flange (22) fixed in position relative to said first flange, and wherein said inflexible part of said diaphragm is movable over a path having one end delimited by said second flange.

14. The device in accordance with claim 13, wherein the second flange is fixedly connected with said first flange.

15. The device in accordance with claim 13, wherein said second flange has a hollow cylindrical extension (23), and said substrate gripping means further comprise a spring (6) which is guided in said hollow cylindrical extension.

16. The device in accordance with claim 13, wherein a support element (24) for the pivotable reception of the grippers (3) is provided between the flange (14) of the device (1) and the fixed flange (22).

17. The device in accordance with claim 16, further comprising connecting elements (25) releasably connecting said second flange and said support element to said first flange.

18. The device in accordance with claim 1, wherein when pressure $P_a$ exceeds pressure $P_v$ by a given amount, said diaphragm moves toward said region at a vacuum pressure and in the process moves said substrate gripper to the substrate release position.

19. The device in accordance with claim 1, further comprising: a first vacuum pump (48) connected for evacuating said second chamber; a fluid flow control element connected for delivering a fluid to said second chamber; and a second vacuum pump (27) connected for evacuating the region enclosed by said vacuum chamber, wherein said first and second vacuum pumps are controllable to permit the level of the pressure $P_a$ to be reduced to approximately the level of the pressure $P_v$.

20. The device in accordance with claim 1, wherein when the pneumatic pressure $P_a$ exceeds the vacuum pressure $P_v$ by a given amount, the resulting pressure differential initiates immediate displacement of said substrate gripper to the substrate release position in a compulsory manner.

21. The device in accordance with claim 1, wherein said substrate gripping means further comprise a tension element for displacing said substrate gripper when the pneumatic pressure corresponds to atmospheric pressure.

22. The device in accordance with claim 1, wherein said substrate gripper is situated at a location at which a pressure occurs which is greater than the vacuum pressure $P_v$.

23. The device in accordance with claim 1, wherein said diaphragm is integrated into said vacuum chamber in such a way that in a first operating position, one side of said diaphragm is exposed to atmospheric pressure $P_a$ and the other side of said diaphragm is exposed to vacuum pressure $P_v$, and in a second operating position both sides of said diaphragm are exposed to vacuum pressure $P_v$.

* * * * *